(12) United States Patent
Hwang et al.

(10) Patent No.: US 10,955,438 B2
(45) Date of Patent: Mar. 23, 2021

(54) CONTACT AND SOCKET DEVICE FOR TESTING SEMICONDUCTOR

(71) Applicants: Dong Weon Hwang, Gyeonggi-do (KR); Logan Jae Hwang, Flower Mound, TX (US); Jae Baek Hwang, Seoul (KR)

(72) Inventors: Dong Weon Hwang, Gyeonggi-do (KR); Logan Jae Hwang, Flower Mound, TX (US); Jae Baek Hwang, Seoul (KR)

( * ) Notice: Subject to any disclaimer, the term of this patent is extended or adjusted under 35 U.S.C. 154(b) by 47 days.

(21) Appl. No.: 16/179,366

(22) Filed: Nov. 2, 2018

(65) Prior Publication Data
US 2020/0049736 A1 Feb. 13, 2020

(30) Foreign Application Priority Data
Aug. 8, 2018 (KR) .......................... 10-2018-0092462

(51) Int. Cl.
*G01R 1/04* (2006.01)
*G01R 31/28* (2006.01)
(Continued)

(52) U.S. Cl.
CPC ......... *G01R 1/0466* (2013.01); *G01R 1/0458* (2013.01); *G01R 31/2863* (2013.01);
(Continued)

(58) Field of Classification Search
CPC ....... H01L 21/00; H01L 2221/00; H01R 3/00; H01R 2101/00; H05K 1/00; H05K 2201/00; H05K 999/00
See application file for complete search history.

(56) References Cited

U.S. PATENT DOCUMENTS

2001/0027040 A1* 10/2001 Yoshioka ............. H05K 9/0018
439/98
2004/0253867 A1* 12/2004 Matsumoto ............ H01H 13/86
439/500
(Continued)

FOREIGN PATENT DOCUMENTS

JP 2016223996 A 12/2016
KR 20060062824 A 6/2006
(Continued)

OTHER PUBLICATIONS

International Search Report issued by ISA/KR in connection with PCT/KR2018/012602 dated Mar. 11, 2019.

*Primary Examiner* — Jermele M Hollington
*Assistant Examiner* — Temilade S Rhodes-Vivour
(74) *Attorney, Agent, or Firm* — Levenfeld Pearlstein, LLC

(57) ABSTRACT

Disclosed are a hybrid-type contact and a socket device for testing a semiconductor device, in which the hybrid-type contact includes a first contact unit integrally configured by rolling a predetermined shaped strip pattern formed by blanking a metal plate into a cylindrical shape, a second contact unit with conductivity and elasticity configured to be inserted into the first contact unit, and a molding portion of insulating elastic material configured to integrally fix the first contact unit and the second contact unit together, so as to compensate the disadvantages of conventional pin-type and rubber-type test socket devices, whereby it is easy to optimize the mechanical and electrical properties according to the requirements of the test device, and it is suitable for testing a fine pitch device.

16 Claims, 17 Drawing Sheets

(51) Int. Cl.
  *H01R 13/11*   (2006.01)
  *H01R 13/24*   (2006.01)
(52) U.S. Cl.
  CPC ....... *H01R 13/111* (2013.01); *H01R 13/2414* (2013.01); *H01R 13/2421* (2013.01)

(56) References Cited

U.S. PATENT DOCUMENTS

| | | | | |
|---|---|---|---|---|
| 2010/0221960 A1* | 9/2010 | Chung | ..................... | G01R 3/00 |
| | | | | 439/733.1 |
| 2012/0184149 A1* | 7/2012 | Suzuki | ................. | H01R 13/502 |
| | | | | 439/660 |
| 2015/0377923 A1* | 12/2015 | Lee | ..................... | G01R 1/0416 |
| | | | | 324/756.02 |
| 2018/0188290 A1* | 7/2018 | Park | ......................... | H05K 3/28 |

FOREIGN PATENT DOCUMENTS

| | | |
|---|---|---|
| KR | 101193556 B1 | 10/2012 |
| KR | 101266123 B1 | 5/2013 |
| KR | 1020160084399 A | 7/2016 |
| KR | 101860923 B1 | 5/2018 |

\* cited by examiner

CONTACT AND SOCKET DEVICE FOR TESTING SEMICONDUCTOR

CROSS REFERENCE TO RELATED APPLICATION

The present application claims priority to Korean Patent Application No. 10-2018-0092462, filed Aug. 8, 2018, the entire contents of which is incorporated herein for all purposes by this reference.

BACKGROUND OF THE INVENTION

Field of the Invention

The present invention relates generally to a contact and a socket device for testing a semiconductor device. More particularly, the present invention relates to a contact, which is mounted in a test socket for testing an IC so as to electrically connect a contact point and a lead, for example, electrically connect leads of an IC and pads of a PCB or electrically connect leads of an IC such as a CPU and a PCB in an electronic device such as a personal computer (PC) and a mobile phone, and a socket device.

Description of the Related Art

A test socket is a part to test the defect of a semiconductor device in the semiconductor post-processing stage, and is a part to be brought into contact with the device at the first end and transmit a signal transmitted through a test device and a test board during the test process to the device.

The test socket requires mechanical contact characteristics in which an individual device moves to a correct position and contacts the test board accurately, and stable electrical contact characteristics for signal transmission without signal distortion at the contact point during signal transfer.

Since the test socket is a consumable part having mechanical and electrical characteristics degraded by a repeated test process, it is necessary to reduce the cost of the test process by extending the lifetime and increasing the number of times the test socket is used.

On the other hand, there are two main causes for determining the lifetime of a test socket. The first cause is socket breakage caused by unstable contact in the mechanical part, and the second cause is the contamination of the contact area due to the continuous contact, which increases the contact resistance and causes the electrical characteristics to become unstable.

A commonly used test socket can be classified into a pin type and a rubber type depending on the type of conductive means connecting the semiconductor device and the test device.

FIGS. 1 and 2 are sectional views of conventional pin-type and rubber-type test sockets, respectively.

Referring to FIG. 1, a pin-type test socket 10 includes: a socket body 11 provided with a plurality of contact pins 12 formed bent to have elasticity; a cover 13 configured to be vertically moveable from above the socket body 11; and a latch 14 rotatably assembled to the socket body 11 such that a device 20 is latched or unlatched in conjunction with the vertical movement of the cover 13.

The contact pins 12 have elasticity in the vertical direction and electrically connect the terminals of the device to the pads of the test apparatus. Various contact pins are provided according to the material and the shape of the terminals of the device and the pad of the test apparatus. For example, there is a pogo pin constituted by a plunger, a barrel, and a spring.

The latch 14 is formed with a guide slot 14a, wherein a guide pin 15a is fastened to the guide slot 14a, and the guide pin 15a is fixed to a drive link 15 whose one end is hinged to the cover 13. The cover 13 is elastically supported by a coil spring 16.

When the cover 13 is pushed, the pin-type test socket 10 configured as described above can load the device 20 as the latch 14 is opened outward, and when the cover 13 is released, the pin type test socket is fixed by the latch 14 pressing the upper portion of the device 20 by the elastic restoring force of the coil spring 15.

However, the pin-type test socket is problematic in that it has a spiral or curved structure for the contact pins 12 to have elasticity, which leads to signal loss due to a long current path, and is disadvantageous in the super high frequency band. Also, in the fine pitch test socket, the manufacturing process of the housing structure in which the contact pins 12 are accommodated is complicated and the cost is greatly increased.

Next, referring to FIG. 2, a rubber-type test socket 30 includes: a connector body 31 having elasticity by insulating silicone powder being solidified; and a conductive silicon portion 32 corresponding to a solder ball (terminal) 21 of the device 20 and vertically penetrating through the connector body 31. The conductive silicon portion 32 has a substantially cylindrical shape vertically penetrating through the connector body 31.

Describing a method of manufacturing the rubber-type test socket, when a silicon mixture in which insulating silicon and conductive powder are mixed at a predetermined ratio is put into a mold and a magnetic field is formed at the position where the conductive silicon portion 32 is to be formed, the conductive powder of the silicon mixture is collected at the magnetic field forming position, and finally, the molten silicon mixture is solidified to obtain the test socket 30 in which the conductive silicon portion 32 is formed.

The test socket 30 manufactured as described above is configured such that a test apparatus is positioned at the lower portion thereof, and the lower end of the conductive silicon portion 32 is in contact with pads and the upper end thereof is in electrical contact with the solder ball 21 by being pressed at a predetermined pressure by the device 20.

Since the rubber-type test socket 30 has elasticity by being made of a soft material, the upper surface of the conductive silicon portion 32 surrounds the solder ball 21 and makes stable electrical contact, and here, the center of the conductive silicon portion 32 is expanded convexly.

However, the rubber-type test socket 30 is problematic in that the elasticity is lost during repetitive testing and the service life is remarkably reduced. Therefore, the number of times of use is short and the cost increases due to frequent replacement.

Particularly, in the rubber type test socket, it is not easy to secure a sufficient insulation distance L between the adjacent conductive silicon portions 32 in a fine pitch device, and a short circuit is likely to occur.

Specifically, in a test socket for a fine pitch device, it is very important to secure a sufficient insulating distance L between the neighboring conductive silicon portions 32 when the distance between the conductive silicon portions 32 is very short.

However, as described above, the rubber-type test socket 30 is configured such that by applying the magnetic field to the silicon mixed molten mixture in which insulating silicon and conductive powder are mixed, the conductive powder is collected along a magnetic path to form the conductive silicon portion 32. Thus, the conductive powder collected along the magnetic path is not distributed within the precisely defined size d, and the density D of the conductive powder has a continuously decreasing section δ.

Accordingly, the rubber-type test socket 30 is problematic in that since the conductive silicon portion 32 has a predetermined decreasing section δ rather than a precisely defined diameter d, the insulation distance L between the neighboring conductive silicon portions 32 is considerably shorter, which is quite disadvantageous for use with test sockets for fine pitch.

The rubber-type test socket is further problematic in that since a magnetic field should be applied for a considerable time in order to obtain a sufficient conductive powder density along the magnetic path where the magnetic field is concentrated by applying a magnetic field to the silicon mixed melt during the manufacturing process, the manufacturing process is lengthened.

In the burn-in test process, in which the thermal stress of the device is tested, the test is performed over 100° C. from several tens of hours to a maximum of 1000 hours. Therefore, the rubber-type test socket may suffer from poor electrical contact between the device and the contact due to the reduced elasticity of the silicone during the burn-in test.

Accordingly, the present inventor has developed a new type of hybrid contact and test socket device, which can overcome the disadvantages of the conventional pin-type and rubber-type test sockets and can combine advantages thereof.

The foregoing is intended merely to aid in the understanding of the background of the present invention, and is not intended to mean that the present invention falls within the purview of the related art that is already known to those skilled in the art.

Documents of Related Art (Patent Document 1) Korean Patent Application Publication No. 10-2006-0062824 (published Jun. 12, 2006)
(Patent Document 2) Korean Patent No. 10-1860923 (published May 24, 2018)

SUMMARY OF THE INVENTION

Accordingly, the present invention has been made keeping in mind the above problems occurring in the related art, and the present invention is intended to propose a test socket device, in which the disadvantages of conventional pin-type and rubber-type test socket devices can be overcome, the durability of the rubber-type contact itself during the burn-in test can be improved, and the test socket device is suitable for a fine pitch device with excellent electrical properties and extended service life.

The present invention is further intended to propose a hybrid-type contact, which has a structure suitable for a test socket device for a fine pitch device.

In order to achieve the above object, according to some aspect of the present invention, there is provided a hybrid-type contact includes: a first contact unit integrally configured by rolling a predetermined shaped strip pattern formed by blanking a metal plate into a cylindrical shape; a second contact unit with conductivity and elasticity configured to be inserted into the first contact unit; and a molding portion of insulating elastic material configured to integrally fix the first contact unit and the second contact unit together.

According to some aspect of the present invention, there is further provided a test socket, which includes the above described hybrid-type contact, includes: a mounting portion formed with a plurality of through-holes corresponding to terminals of a device to accommodate the hybrid-type contact; and an insulating body portion with elasticity configured to fix the hybrid-type contact integrally with the mounting portion.

According to the present invention, the hybrid-type contact includes a first contact unit integrally configured by rolling a predetermined shaped strip pattern formed by blanking a metal plate into a cylindrical shape, a second contact unit with conductivity and elasticity configured to be inserted into the first contact unit, and a molding portion of insulating elastic material configured to integrally fix the first contact unit and the second contact unit together, so as to compensate the disadvantages of conventional pin-type and rubber-type test socket devices, whereby it is easy to optimize the mechanical and electrical properties according to the requirements of the test device, and it is suitable for testing a fine pitch device.

Further, according to the hybrid-type contact of the present invention, it is possible to secure stable characteristics even in a high temperature environment for a long time during the burn-in test, thereby improving the operational reliability which is a problem of a conventional rubber-type test socket device.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

All terms or words used in the specification and claims should not be interpreted as being limited merely to common and dictionary meanings but should be interpreted as having meanings and concepts which are defined within the technical scope of the present invention.

Reference will now be made in greater detail to exemplary embodiments of the present invention, examples of which are illustrated in the accompanying drawings. The exemplary embodiments described hereinbelow are provided for fully conveying the scope and spirit of the invention to those skilled in the art, so it should be understood that the embodiments may be changed to a variety of embodiments and the scope and spirit of the invention are not limited to the embodiments described hereinbelow.

The present invention mainly includes: a first contact unit integrally configured by rolling a predetermined shaped strip pattern formed by blanking a metal plate into a cylindrical shape; a second contact unit with conductivity and elasticity configured to be inserted into the first contact unit; and a molding portion of insulating elastic material configured to integrally fix the first contact unit and the second contact unit together. Hereinbelow, a hybrid-type contact according to exemplary embodiments of the present invention will be described in detail with reference to the accompanying drawings.

First Embodiment

Figure 1:
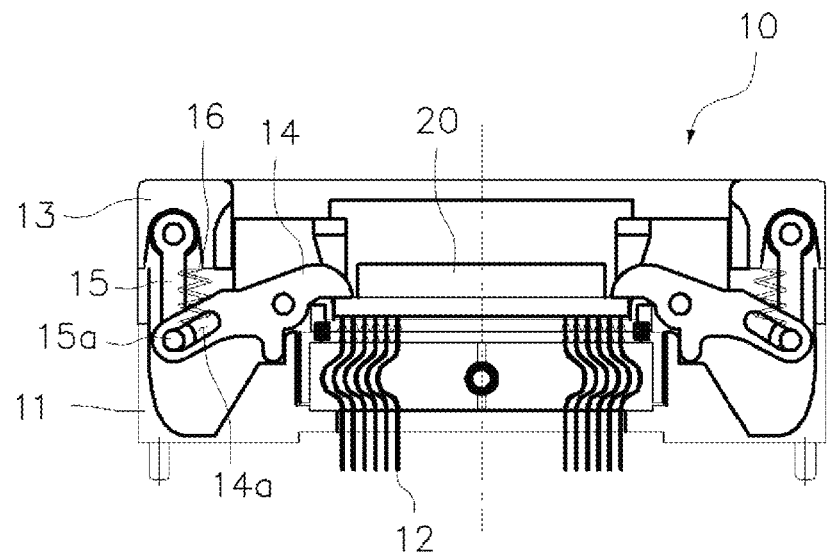
FIGS. 1 and 2 are sectional views of conventional pin-type and rubber-type test sockets, respectively.
Figure 2:
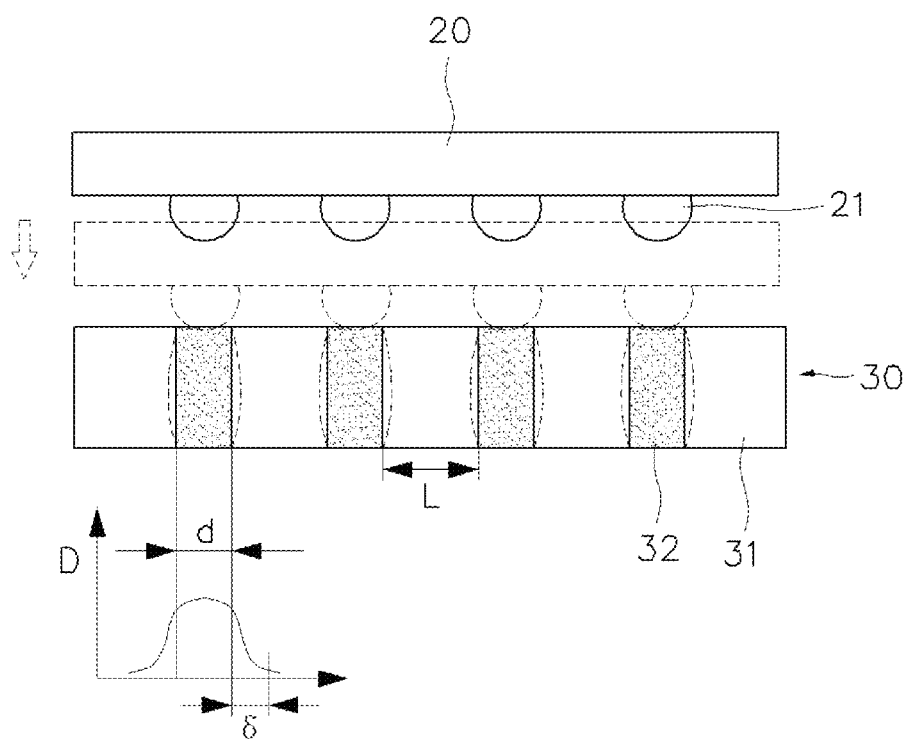
Figure 3:
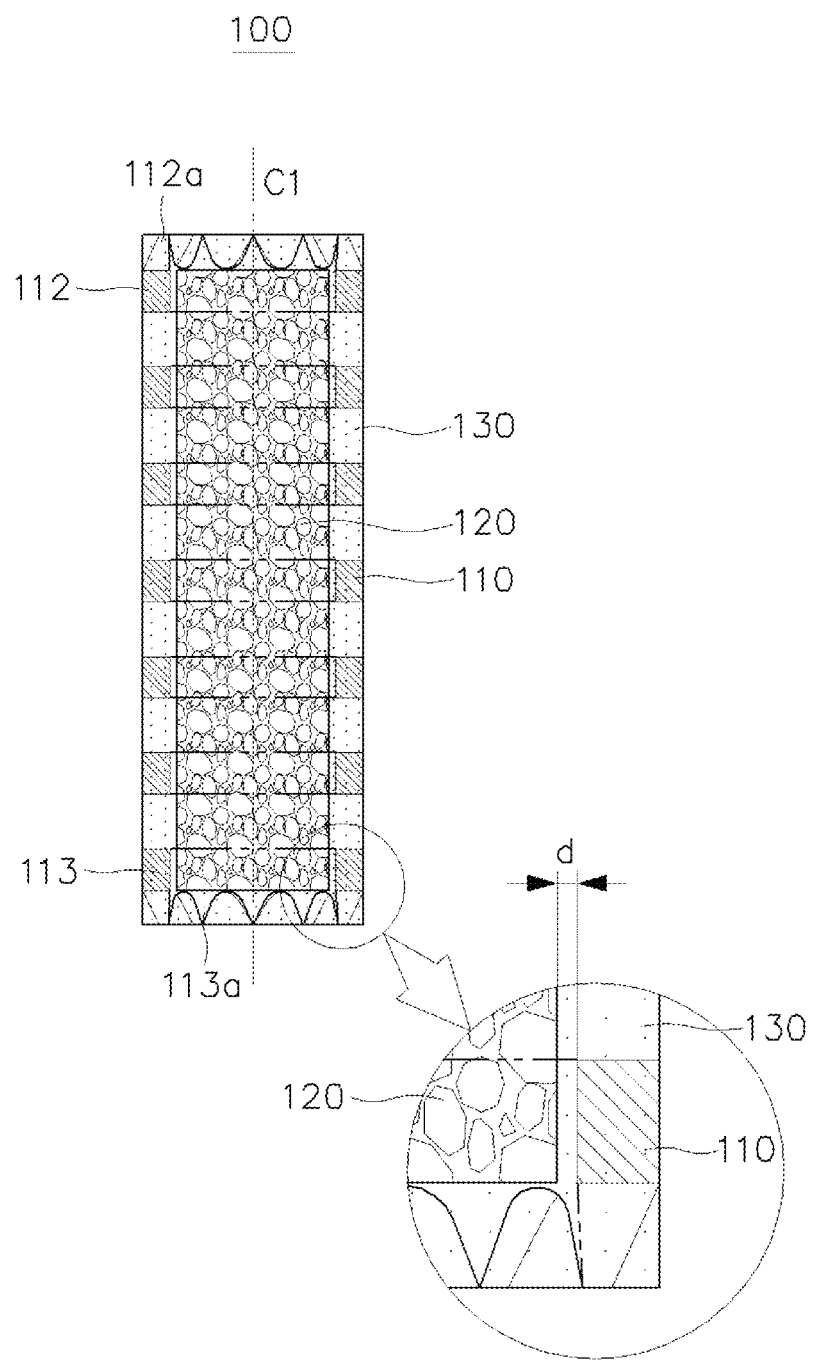
FIGS. 3 and 4 are a longitudinal sectional view and a plan view of a hybrid-type contact according to a first embodiment of the present invention.
Figure 4:
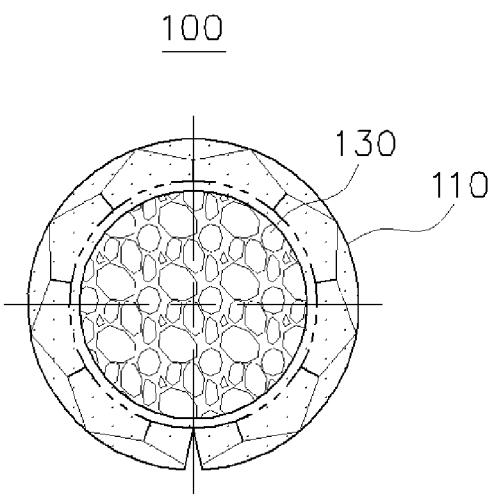

FIGS. 3 and 4 are a longitudinal sectional view and a plan view of a hybrid-type contact according to a first embodiment of the present invention.

Referring to FIGS. 3 and 4, a hybrid-type contact 100 according to the embodiment includes: a first contact unit 110 integrally configured by rolling a strip pattern formed by blanking a metal plate into a cylindrical shape; a second contact unit 120 with conductivity and elasticity configured to be inserted into the first contact unit 110; and a molding portion 130 of insulating elastic material configured to integrally fix the first contact unit 110 and the second contact unit 120 together.

The first contact unit 110 is a cylindrical pin-type contact having a predetermined radius (<1 mm) by rolling a predetermined shaped strip pattern formed by blanking a metal plate, and has elasticity in the axial direction C1.

Figure 5:
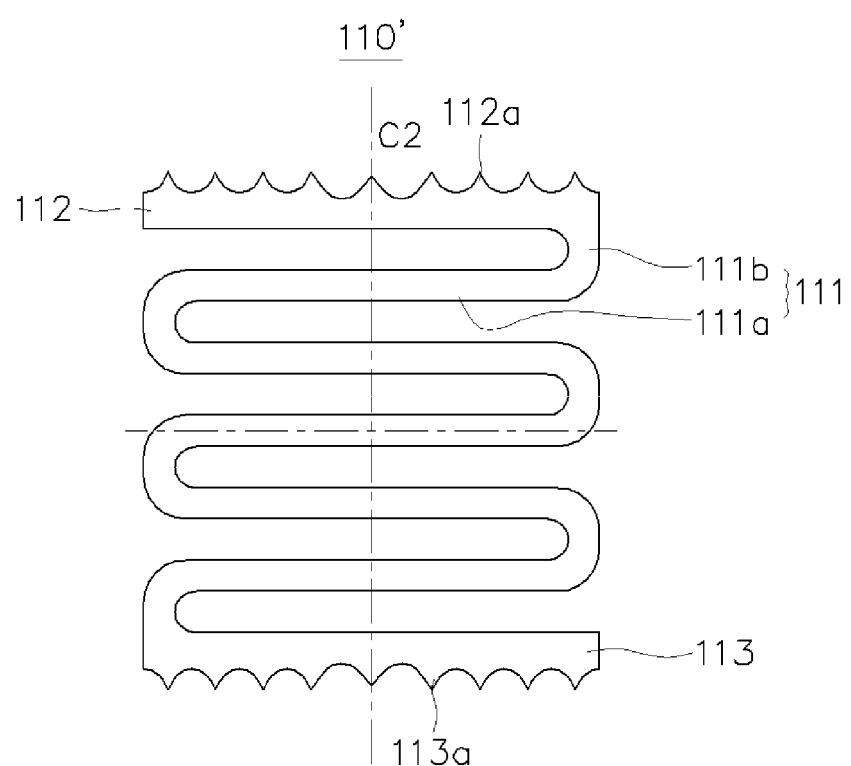
FIGS. 5 to 7 are views of a first contact unit of the hybrid-type contact according to the first embodiment of the present invention.
Figure 6:
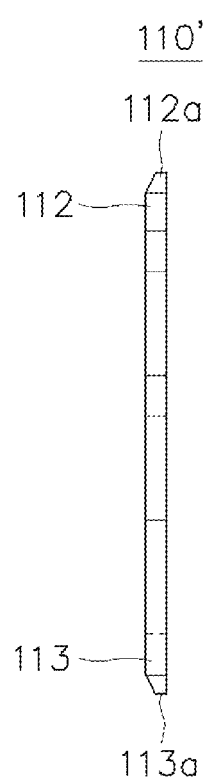
Figure 7:
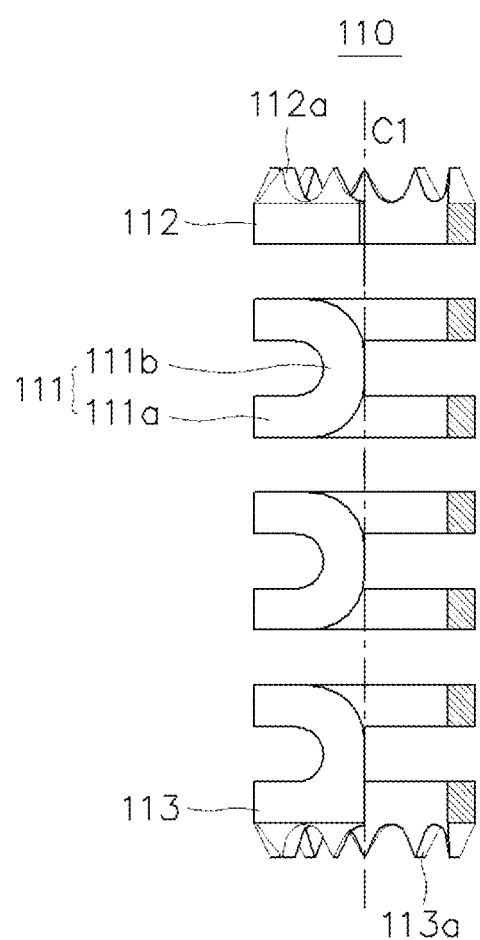

FIGS. 5 to 7 are views of the first contact unit of the hybrid-type contact according to the first embodiment of the present invention, wherein FIG. 5 is the strip pattern in an unfolded state, FIG. 6 is a side view of the strip pattern, and FIG. 7 is a front view of the first contact unit rolled in a cylindrical shape.

Referring to FIGS. 5 and 6, the strip pattern 110' of the first contact unit includes: an elastic portion 111 configured such that a unit strip 111a and 111b constituted by a horizontal strip 111a and a vertical strip 111b is connected in a zigzag pattern; an upper head portion 112 provided with an upper tip portion 112a protruding upward and configured to extend from an uppermost end of the elastic portion 111; and a lower head portion 113 provided with a lower tip portion 113a protruding downward and configured to extend from a lowermost end of the elastic portion 111.

The first contact unit may be manufactured by blanking a plate mainly of beryllium copper (BeCu), a copper alloy, stainless steel (SUS), or the like into a predetermined pattern and bending the same into a cylindrical shape to make a contact, and the surface thereof may be plated with gold, palladium (Pd), palladium nickel (PdNi), or palladium cobalt (PdCo).

The elastic portion 111 includes the unit strip 111a and 111b constituted by the horizontal strip 111a and the vertical strip 111b vertically extending from an end of the horizontal strip 111a with a length shorter than the horizontal strip 111a, wherein a plurality of unit strips 111a and 111b are connected in a zigzag pattern.

The upper head portion 112 and the lower head portion 113 are provided along edges thereof with the tooth shaped upper tip portion 112a and the lower tip portion 113b respectively to come into contact with terminals of a device and pads of a test apparatus.

In the embodiment, the upper head portion 112 and the lower head portion 113 are the same as the horizontal strip 111a of the elastic portion 111, but not limited thereto, the width and length thereof may be different.

The planar strip pattern 110' is bent into a cylindrical shape based on the center of the horizontal strip 111a as a vertical axis C2.

FIG. 7 is a front view showing a state where a part of the first contact unit rolled in a cylindrical shape is cut away.

Meanwhile, in the embodiment, the first contact unit 110 may be provided by various strip patterns. For example, a plurality of closed loops may be connected at several sections of the elastic portion in the longitudinal direction, or there may be various modifications such as a helical strip pattern.

Referring again to FIGS. 3 and 4, the second contact unit 120 is a member that is inserted into the first contact unit 110 and has conductivity and elasticity. Preferably, the second contact unit is in an insulating cylindrical shape of elastic material mixed with conductive particles. For example, second contact unit 120 may be manufactured in such a manner that a mixture of a conductive powder and an insulating silicone powder is filled in a cylindrical mold and is solidified after melting, thereby obtaining the cylindrical second contact unit 120 with conductivity and elasticity.

The conductive particles may be particles of metal material, may be particles of metal or non-metal particle plated with gold (Au), silver (Ag), palladium (Pd), palladium nickel (PdNi), or palatal cobalt (PdCo), or may include carbon nanotubes and the like.

As the insulating material constituting the second contact unit 120, an elastic polymer material may be used, and typically, silicon may be used but is not limited thereto.

After the second contact unit 120 is inserted into the first contact unit 110 and temporarily assembled, the first contact unit 110 and the second contact unit 120 are integrally fixed by the molding portion 130. As the material of the molding portion 130, a material having elasticity and insulation property may be used. For example, silicone may be used, but is not limited thereto.

Meanwhile, the first contact unit 110 and the second contact unit 120 may be fabricated as individual units of hybrid-type contact using a mold, or may be fabricated as the socket unit in such a manner that in the state where a plurality of first contact units and second contact units are temporarily assembled to a separate socket body, the molding portion 130 is integrally provided by molding together with the socket body.

As shown in FIG. 3, the second contact unit 120 has an outer diameter smaller than the inner diameter of the first contact unit 110 and is located on a concentric axis with a predetermined distance d, whereby the process of inserting the second contact unit 120 into the first contact unit 110 can be facilitated. Meanwhile, since the second contact unit 120 has a predetermined elasticity and is assembled with the first contact unit 110, the second contact unit 120 may be fabricated to have the same outer diameter as the inner diameter of the first contact unit 110 to be press-fitted in the first contact unit 110.

Further, in FIG. 3, the molding portion 130 corresponds to the height from the upper head portion 112 to the lower head portion 113 of the first contact unit 110, but if necessary, the molding portion may be provided only in the elastic portion, where a large electrical resistance occurs, except for the upper head portion and the lower head portion.

Particularly, in the embodiment, the second contact unit 120 containing the conductive particles is inserted only inside the first contact unit 110, and thus, in the compression section of the first contact unit 110 having an elastic force in the axial direction C, only the molding portion 130 of elastic material is provided to prevent interference of elastic deformation of the first contact unit 110 caused by the conductive particles.

Second Embodiment

Figure 8:
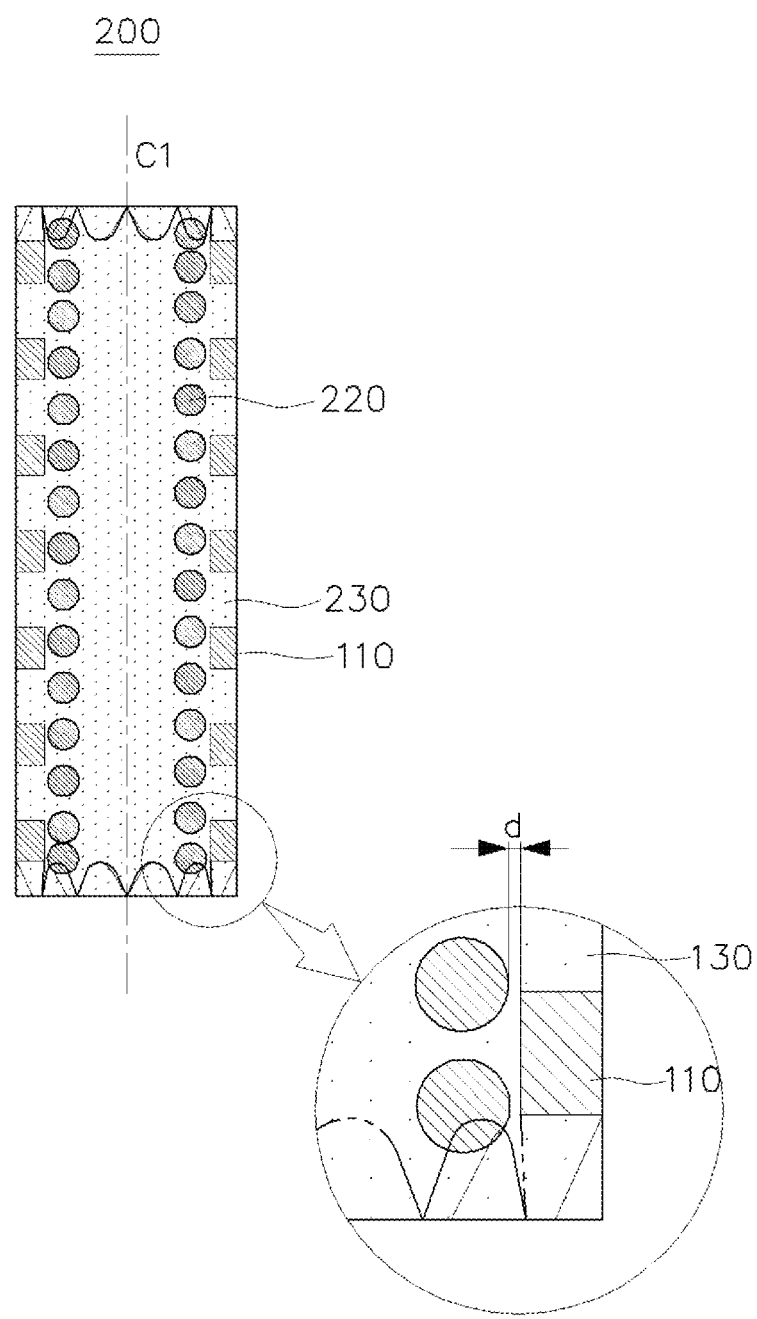
FIGS. 8 and 9 are a longitudinal sectional view and a plan view of a hybrid-type contact according to a second embodiment of the present invention.
Figure 9:
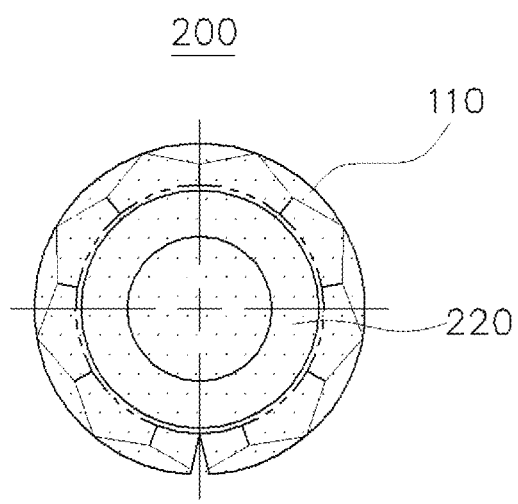

FIGS. 8 and 9 are a longitudinal sectional view and a plan view of a hybrid-type contact according to a second embodiment of the present invention. For reference, the same reference numerals are used for the same configurations as in the first embodiment, and redundant explanations will be omitted.

Referring to FIGS. 8 and 9, a hybrid-type contact 200 according to the embodiment includes: a first contact unit 110 integrally configured by rolling a strip pattern formed by blanking a metal plate into a cylindrical shape; a coil spring 220 with conductivity and elasticity in the axial direction C1 configured to be inserted into the first contact unit 110; and a molding portion 230 of insulating elastic material configured to integrally fix the first contact unit 110 and the coil spring 220 together.

Preferably, the coil spring 220 is made of stainless steel (SUS) with excellent mechanical properties. The coil spring 220 is inserted into the first contact unit 110 and serves as a conduction path for transmitting a signal while elastically supporting the terminal of the device and the pad of the test apparatus together with the first contact unit 110. In particular, the coil spring 220 of stainless steel is superior in mechanical properties, so that it maintains stable characteristics (elastic force) even in a high temperature environment such as a burn-in test. Thus, the mechanical properties that cannot be obtained by the first contact unit 110 and the molding portion 230 alone can be supplemented to improve the reliability.

Preferably, the outer diameter of the coil spring 220 is smaller than the inner diameter of the first contact unit 110 to have a predetermined distance d therebetween, and thus, when the coil spring 220 is inserted into the first contact unit 110 in the temporary assembly process, a sufficient clearance is secured, and the coil spring 220 and the first contact unit 110 are prevented from interfering with each other during operation.

After the coil spring 220 is inserted into the first contact unit 110 and temporarily assembled, the first contact unit 110 and the coil spring 220 are integrally fixed by the molding portion 230. This assembly process is the same as in the first embodiment.

Third Embodiment

Figure 10:
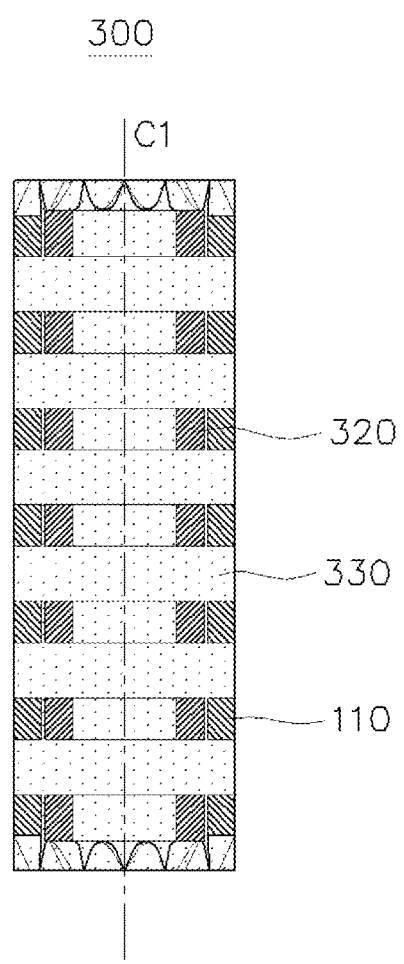
FIGS. 10 and 11 are a longitudinal sectional view and a plan view of a hybrid-type contact according to a third embodiment of the present invention.
Figure 11:
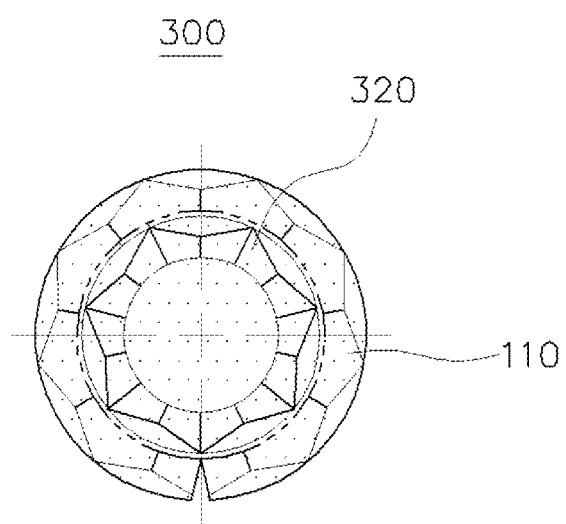

FIGS. 10 and 11 are a longitudinal sectional view and a plan view of a hybrid-type contact according to a third embodiment of the present invention. The same reference numerals are used for the same configurations as in the above embodiment, and redundant explanations will be omitted.

As shown in FIGS. 10 and 11, a hybrid-type contact 300 according to the embodiment includes: a first contact unit 110 integrally configured by rolling a strip pattern formed by blanking a metal plate into a cylindrical shape; a second contact unit 320 integrally configured by rolling a strip pattern formed by blanking a metal plate into a cylindrical shape, and inserted into the first contact unit 110; and a molding portion 330 of insulating elastic material configured to integrally fix the first contact unit 110 and the second contact unit 320 together.

Similar to the first contact unit 110, the second contact unit 320 is a cylindrical pin-type contact processed by being a strip pattern, and here, the first contact unit 110 and the second contact unit 320 may be pin-type contacts having the same strip pattern or pin-type contacts having different strip patterns.

After the second contact unit 320 is inserted into the first contact unit 110 and temporarily assembled, the first contact unit 110 and the second contact unit 320 are integrally fixed by the molding portion 330. This assembly process is the same as in the first embodiment.

Fourth Embodiment

Figure 12:
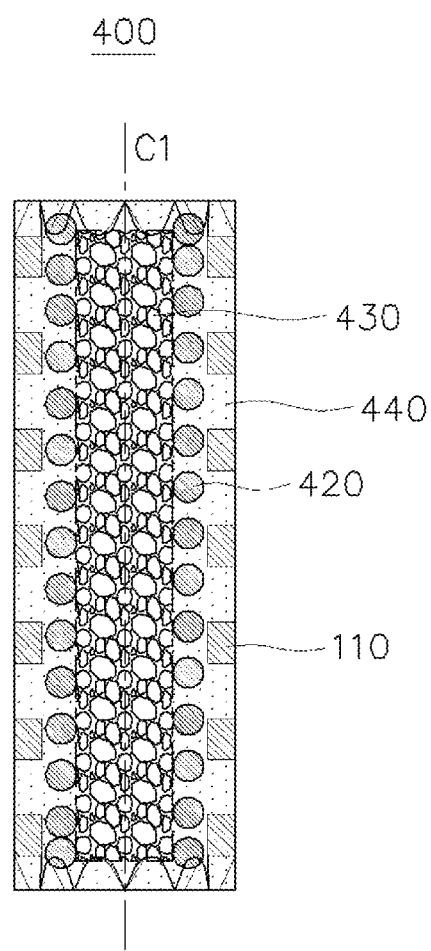
FIG. 12 is a longitudinal sectional view of a hybrid-type contact according to a fourth embodiment of the present invention.

FIG. 12 is a longitudinal sectional view of a hybrid-type contact according to a fourth embodiment of the present invention.

Referring to FIG. 12, a hybrid-type contact 400 according to the embodiment includes: a first contact unit 110 integrally configured by rolling a strip pattern formed by blanking a metal plate into a cylindrical shape; a second contact unit 420 with conductivity and elasticity configured to be inserted into the first contact unit 110; a third contact unit 430 with conductivity and elasticity configured to be inserted into the second contact unit 420; and a molding portion 440 of insulating elastic material configured to integrally fix the first contact unit 110, the second contact unit 420, and the third contact unit 430 together.

In the embodiment, the second contact unit 420 is a coil spring, and the cylindrical insulating third contact unit 430 of elastic material mixed with conductive particles is inserted into the coil spring. The third contact unit 430 is the same as in the first embodiment, and redundant explanations will be omitted.

The hybrid-type contact 400 configured as described above is advantageous in that the combination of the coil spring with excellent mechanical properties and the third contact unit 430 with elasticity and conductivity gives excellent electrical characteristics and operational reliability even in high temperature environments such as burn-in test.

Figure 13:
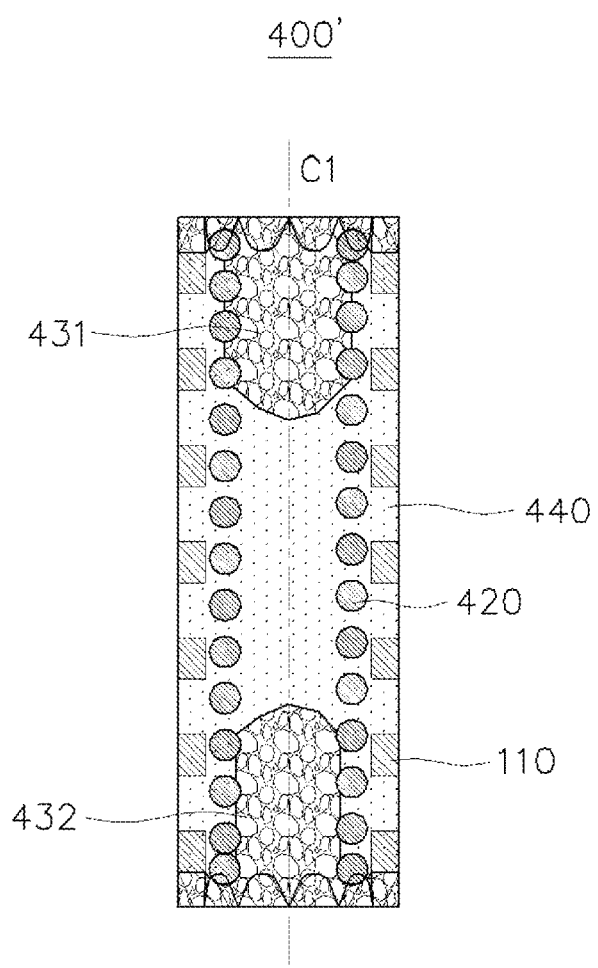
FIG. 13 is a longitudinal sectional view of a modification of the hybrid-type contact according to the fourth embodiment of the present invention.

FIG. 13 is a longitudinal sectional view of a modification of the hybrid-type contact according to the fourth embodiment of the present invention.

As shown in FIG. 13, a hybrid-type contact 400' of the modification is configured such that a third contact unit 431, 432 is inserted into the second contact unit 420 as in the above embodiment, and the third contact unit 431, 432 is provided only at lower and upper portions of the second contact unit 420 with which terminals of the device and pads of a test apparatus come into contact, and the molding portion 440 is filled at the center thereof.

Meanwhile, in the modification, the third contact unit 431, 432 is provided at both lower and upper portions of the second contact unit 420, but may be provided at either lower or upper portion thereof.

Fifth Embodiment

Figure 14:
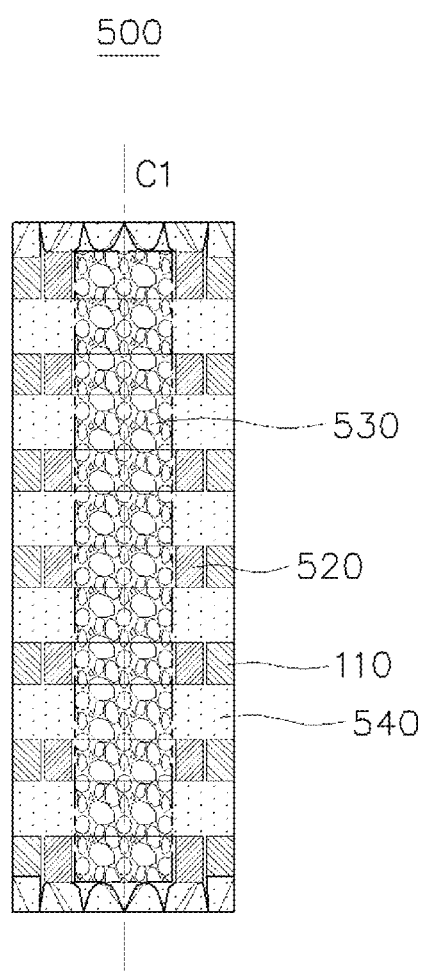
FIG. 14 is a longitudinal sectional view of a hybrid-type contact according to a fifth embodiment of the present invention.

FIG. 14 is a longitudinal sectional view of a hybrid-type contact according to a fifth embodiment of the present invention.

Referring to FIG. 14, a hybrid-type contact 500 according to the embodiment includes: a first contact unit 110 integrally configured by rolling a strip pattern formed by blanking a metal plate into a cylindrical shape; a second contact unit 520 with conductivity and elasticity configured to be inserted into the first contact unit 110; a third contact unit 530 with conductivity and elasticity configured to be inserted into the second contact unit 520; and a molding portion 540 of insulating elastic material configured to integrally fix the first contact unit 110, the second contact unit 520, and the third contact unit 530 together.

In the embodiment, the second contact unit 520 is a cylindrical pin-type contact foamed by blanking a metal plate and bending the same into a cylindrical shape, wherein the first contact unit 110 and the second contact unit 520 may be pin-type contacts having the same strip pattern or pin-type contacts having different strip patterns.

The cylindrical insulating third contact unit 530 of elastic material mixed with conductive particles is inserted into the second contact unit 520. The third contact unit 530 is the same as in the first embodiment, and redundant explanations will be omitted.

The hybrid-type contact 500 configured as described above is advantageous in that the combination of the second contact unit 520 with a fin-type electrical characteristic and the third contact unit 530 with elasticity and conductivity is particularly effective in device testing where excellent electrical properties are required.

Figure 15:
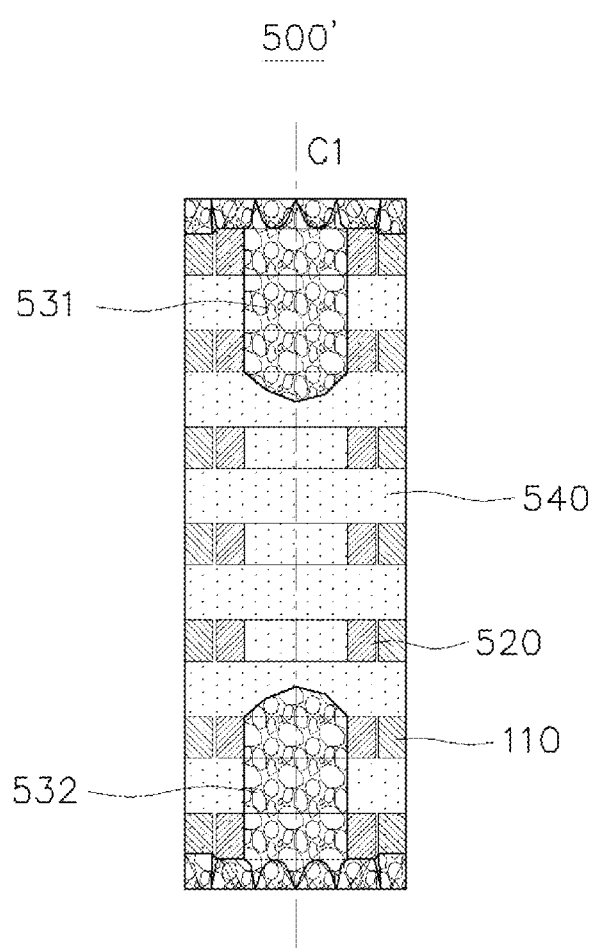
FIG. 15 is a longitudinal sectional view of a modification of the hybrid-type contact according to the fifth embodiment of the present invention.

FIG. 15 is a longitudinal sectional view of a modification of the hybrid-type contact according to the fifth embodiment of the present invention.

Referring to FIG. 15, a hybrid-type contact 500' of the modification is configured such that a third contact unit 531, 532 is inserted into the second contact unit 520 as in the above embodiment, and in particular, the third contact unit 531, 532 is provided only at lower and upper portions of the second contact unit 520 with which terminals of the device and pads of a test apparatus come into contact, and the molding portion 540 is filled at the center thereof.

Meanwhile, in the modification, the third contact unit 531, 532 is provided at both lower and upper portions of the second contact unit 520, but may be provided at either lower or upper portion thereof.

Sixth Embodiment

Figure 16:
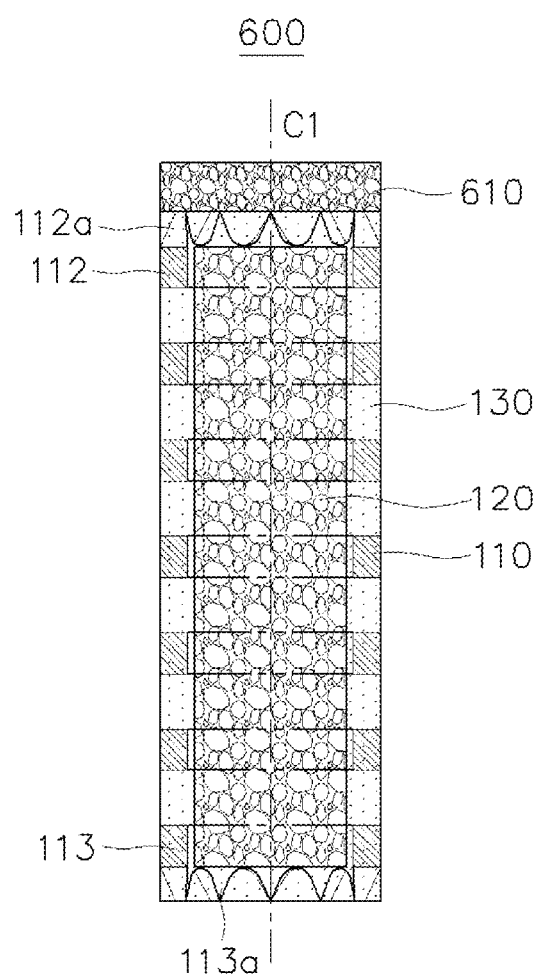
FIG. 16 is a longitudinal sectional view of a hybrid-type contact according to a sixth embodiment of the present invention.

FIG. 16 is a longitudinal sectional view of a hybrid-type contact according to a sixth embodiment of the present invention.

Referring to FIG. 16, a hybrid-type contact 600 according to the embodiment is configured such that a first contact unit 110, a second contact unit 120, and a molding portion 130 are the same as in the first embodiment, and further includes a bumper contact portion 610 of elastic material mixed with conductive particles integrally fixed to upper portions of the first contact unit 110 and the second contact unit 120 by molding portion 130.

Similar to the manufacturing process of the second contact unit 120, the bumper contact portion 610 may be manufactured in such a manner that a mixture of a conductive powder and an insulating silicone powder is melted in a mold and is solidified, and in the state of being disposed to the upper portions of the first contact unit 110 and the second contact unit 120, the bumper contact portion 610 may be integrally fixed by the molding portion 130.

The hybrid-type contact 600 provided with the bumper contact portion 610 at the upper portion thereof can reduce wear of the upper tip portion by mediating contact with the terminals of the device.

In the embodiment, the bumper contact portion is provided in the one end of the contact, but may be provided in opposite ends of the contact. Further, the bumper contact portion is provided in the hybrid-type contact according to the first embodiment, but may be provided in the hybrid-type contacts according to the second embodiment to the fifth embodiment.

As described above, the hybrid-type contact of the present invention mainly includes: the first contact unit integrally configured by rolling a predetermined shaped strip pattern formed by blanking a metal plate into a cylindrical shape; the second contact unit with conductivity and elasticity configured to be inserted into the first contact unit; and the molding portion of insulating elastic material configured to integrally fix the first contact unit and the second contact unit together. Considering the pitch, contact stroke, contact force, contact resistance, frequency bandwidth of the signal, and temperature conditions required according to the test device, an optimized contact can be obtained by combining the first contact unit and the second contact unit described above in various forms or by adding the third contact unit in the second contact unit.

Hereinafter, a test socket using such a hybrid-type contact (abbreviated as "contact" hereinafter) will be described in detail.

First Embodiment

Figure 17:
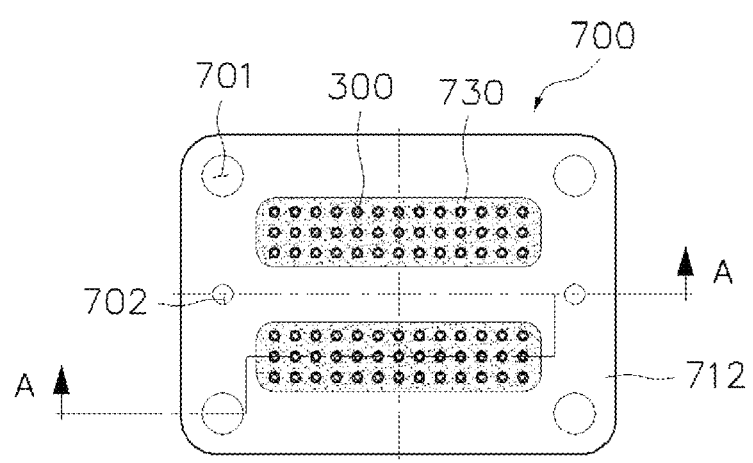
FIG. 17 is a plan view of a test socket according to a first embodiment of the present invention.
Figure 18:
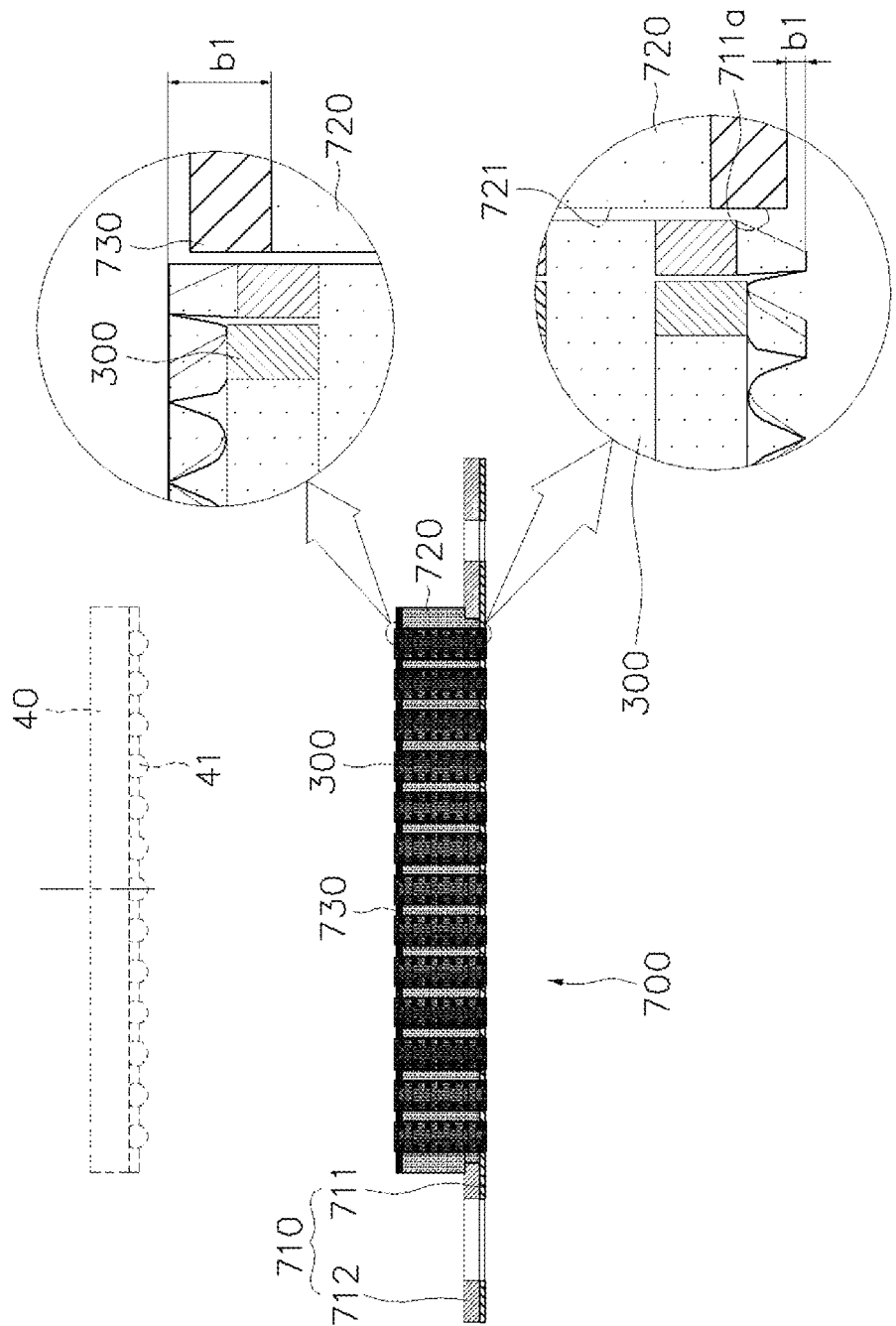
FIG. 18 is a sectional view taken along line A-A of FIG. 17.

FIG. 17 is a plan view of a test socket according to a first embodiment of the present invention; and FIG. 18 is a sectional view taken along line A-A of FIG. 17.

Referring to FIGS. 17 and 18, a test socket 700 according to the embodiment includes: a mounting portion 710 formed with a plurality of through-holes 711a corresponding to terminals 41 of a device 40 to accommodate a contact 300; and an insulating body portion 720 portion with elasticity configured to fix the contact 300 integrally with the mounting portion 710.

The mounting portion 710, which is a planar member, is formed with a plurality of through-holes 711a corresponding to the terminals 41 of the device 40 such that a part of the lower portion of the contact 300 is inserted thereto, and the upper surface thereof is provided with the insulating body portion 720. The mounting portion 710 may include: a plurality of mounting holes 701 to which the test socket is mounted; and a plurality of guide holes to guide an assembling position of the test socket.

In the embodiment, the mounting portion 710 may be constituted by a first mounting portion 711 of insulating material such as resin, and a second mounting portion 712 made of metal (SUS) or resin to form a socket base, but not limited thereto, and only the first mounting portion 711 may constitute the mounting portion.

The insulating body portion 720, which is an insulating member with elasticity, fixes the contact 300 integrally with the mounting portion 710, and the device 40 is seated on the upper surface thereof.

Meanwhile, a mounting seat 730 may be further provided on the upper surface of the insulating body portion 720 such that the device 40 is directly seated thereon, and may be made of insulating resin.

The insulating body portion 720 may be of insulating silicone. The insulating body portion 720 is provided with an accommodating hole 721 in which each contact 300 is accommodated. The accommodating hole 721 may be formed in such a manner that a silicone liquid is injected into a separate mold and is solidified, and then the mold is removed, whereby the accommodating hole 721 is formed in the insulating body portion 720. Next, the mounting portion 710, the insulating body portion 720, and the mounting seat 730 are layered, and the contact 300 is inserted thereinto and integrally molded to fabricate the test socket.

Preferably, the contact 300 is configured such that the lower tip portion protrudes outside the through-holes 711a by a predetermined length b1, whereby it is possible to increase the contact with the pads of the test apparatus.

The upper tip portion of the contact 300 also protrudes outside the upper surface of the insulating body portion 720 facing the device 40 by a predetermined length b2, whereby it is possible to increase the contact with the terminals 41 of the device 40. Meanwhile, the device 40 is mounted directly to the mounting seat 730 provided in the upper portion of the insulating body portion 720. Here, although the height of the mounting seat 730 may be higher than the top of the contact 300, the mounting seat 730 may be compressed during mounting of the device so that, the terminals 41 of the device 40 can come into contact with the upper portion of the contact 300.

In the embodiment, the contact 300 is the contact according to the third embodiment (see FIG. 10), but the contacts according to other embodiments may also be applied.

Second Embodiment

Figure 19:
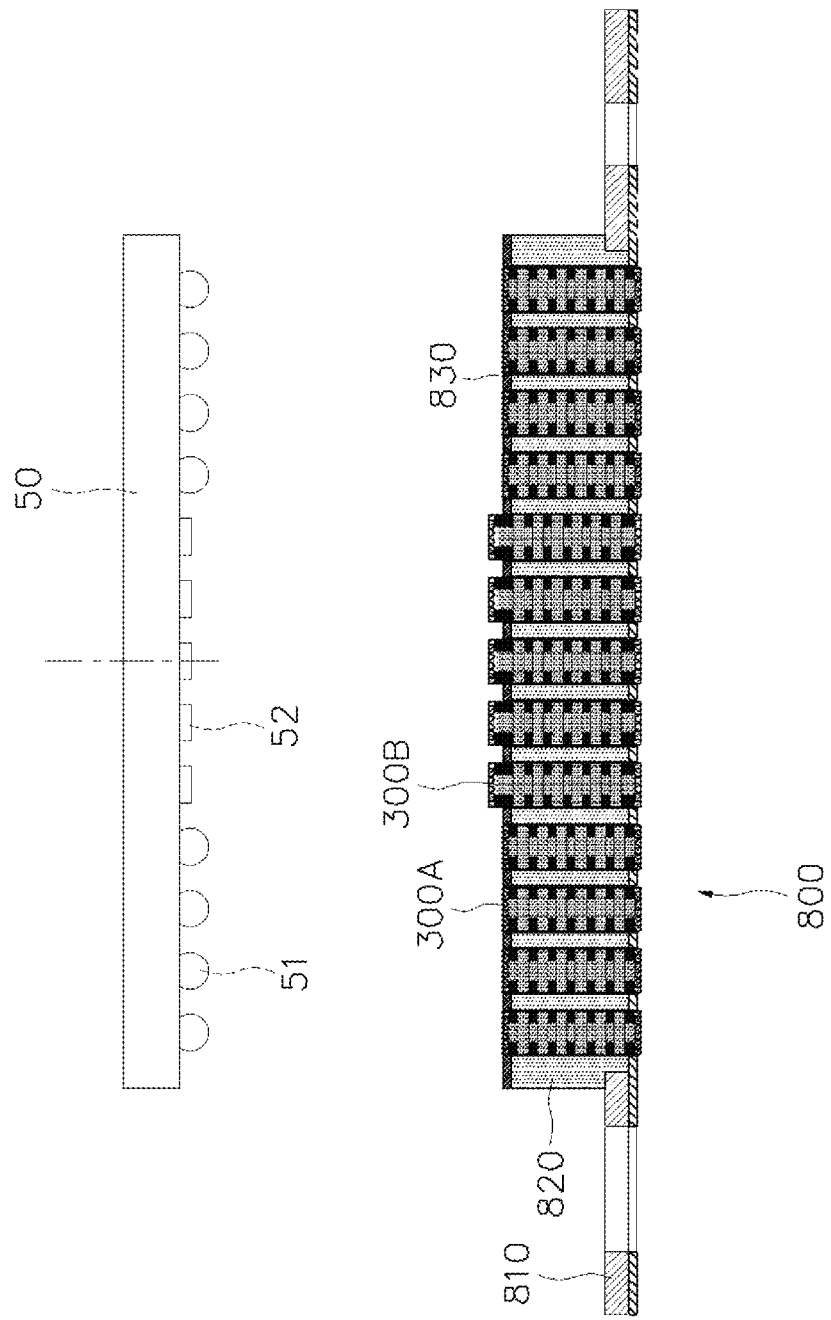
FIG. 19 is a sectional view of a test socket according to a second embodiment of the present invention.

FIG. 19 is a sectional view of a test socket according to a second embodiment of the present invention, wherein the test socket is suitable for a hybrid device 50 with ball-type and land-type terminals 51 and 52.

Referring to FIG. 19, a test socket 800 according to the embodiment may be provided with homogeneous (or heterogeneous) contacts 300A and 300B with different heights according to the terminals 51 and 52 of the device 50.

In the case of the hybrid device 50 with the ball-type terminal and the land-type terminal 52, the contacts 300A and 300B may be provided to be suitable for each terminal, and here, as the contacts 300A and 300B, a BGA type or LGA type contact is used, and a type of contact suitable for each terminal is integrally fixed to the mounting portion 810 along with the insulating body portion 820 and the mounting seat 830 as described in the embodiment.

In the embodiment, the contacts 300A and 300B are homogeneous with different heights, but heterogeneous contacts may be combined.

Although the present invention has been described in conjunction with the preferred embodiments which illustrate the technical spirit of the present invention, it will be apparent to those skilled in the art that the present invention is not limited only to the illustrated and described configurations and operations themselves but variations and modifications are possible without departing from the scope of the spirit of the invention. Accordingly, all of appropriate variations, modifications and equivalents are considered to pertain to the scope of the present invention.

What is claimed is:

1. A hybrid-type contact comprising:
   a first contact unit integrally configured by rolling a strip pattern formed by blanking a metal plate into a cylindrical shape;
   a second contact unit with conductivity and elasticity configured to be inserted into the first contact unit; and
   a molding portion of insulating elastic material configured to integrally fix the first contact unit and the second contact unit together, wherein the molding portion does not protrude beyond the outer diameter of the first contact unit.

2. The hybrid-type contact of claim 1, wherein the second contact unit is in a cylindrical shape of elastic material mixed with conductive particles.

3. The hybrid-type contact of claim 1, wherein the second contact unit is a coil spring.

4. The hybrid-type contact of claim 1, wherein the second contact unit is integrally configured by blanking a metal plate and rolling the metal plate into a cylindrical shape.

5. The hybrid-type contact of claim 1 further comprising a third contact unit with conductivity and elasticity configured to be inserted into the second contact unit and be integrally fixed by the molding portion.

6. The hybrid-type contact of claim 5, wherein the third contact unit is disposed on at least one of upper and lower portions of the second contact unit.

7. The hybrid-type contact of claim 1 further comprising a bumper contact portion of elastic material mixed with conductive particles integrally fixed to upper portions of the first contact unit and the second contact unit by the molding portion.

8. The hybrid-type contact of claim 1, wherein the first contact unit includes:
   an elastic portion configured such that unit strips each constituted by a horizontal strip and a vertical strip vertically extending from an end of the horizontal strip with a length shorter than the horizontal strip are connected in a zigzag pattern and are bent into a cylindrical shape;
   an upper head portion provided with an upper tip portion protruding upward and configured to extend from an uppermost end of the elastic portion and be bent into a cylindrical shape; and
   a lower head portion provided with a lower tip portion protruding downward and configured to extend from a lowermost end of the elastic portion and be bent into a cylindrical shape.

9. A test socket, which includes a hybrid-type contact according to claim 1, the test socket comprising:
   a mounting portion formed with a plurality of through-holes corresponding to terminals of a device to accommodate the hybrid-type contact; and
   an insulating body portion with elasticity configured to fix the hybrid-type contact integrally with the mounting portion.

10. The test socket of claim 9, wherein the mounting portion includes an insulating plate member having a hole for mounting and a hole for guiding an assembling position.

11. The test socket of claim 9, wherein the mounting portion includes:
an insulating first mounting portion formed with the through-holes and supported by the insulating body portion; and
a second mounting portion mounted to an upper portion of the first mounting portion,
wherein each of the first mounting portion and the second mounting portion includes a hole for mounting and a hole for guiding an assembling position formed therethrough.

12. The test socket of claim 9 further comprising an insulating mounting seat provided on an upper surface of the insulating body portion and formed with through-holes corresponding to the through-holes of the mounting portion.

13. The test socket of claim 12, wherein the hybrid-type contact is configured such that a lower tip portion thereof protrudes outside the through-holes of the mounting portion and an upper tip portion protrudes outside an upper surface of the mounting seat facing the device.

14. The test socket of claim 12, wherein the hybrid-type contact is configured such that an upper tip portion thereof is disposed at a position lower than an upper surface of the mounting seat facing the device.

15. The test socket of claim 9, wherein the hybrid-type contact further includes a bumper contact portion with conductivity and elasticity on an upper portion.

16. The test socket of claim 9, wherein the hybrid-type contact is constituted by a plurality of contacts with different lengths to test a hybrid device with heterogeneous terminals having different lengths.

* * * * *